US009552266B2

(12) United States Patent
Taylor, III et al.

(10) Patent No.: US 9,552,266 B2
(45) Date of Patent: Jan. 24, 2017

(54) SYSTEMS AND METHODS FOR DATA GENERATION

(71) Applicant: GenRocket, Inc., Natick, MA (US)

(72) Inventors: Hycel B. Taylor, III, Dedham, MA (US); Gregg Bolinger, Witchita, KS (US)

(73) Assignee: GenRocket, Inc., Natick, MA (US)

( * ) Notice: Subject to any disclaimer, the term of this patent is extended or adjusted under 35 U.S.C. 154(b) by 105 days.

(21) Appl. No.: 13/857,661

(22) Filed: Apr. 5, 2013

(65) Prior Publication Data

US 2014/0143525 A1 May 22, 2014

Related U.S. Application Data

(60) Provisional application No. 61/621,723, filed on Apr. 9, 2012.

(51) Int. Cl.
| | | |
|---|---|---|
| G06F 11/36 | (2006.01) | |
| G06F 11/22 | (2006.01) | |
| G01R 31/3183 | (2006.01) | |

(52) U.S. Cl.
CPC ... G06F 11/2273 (2013.01); G01R 31/318371 (2013.01)

(58) Field of Classification Search
CPC .............. G06F 7/78; G06F 8/00–8/78; G06F 9/44–9/455; G06F 11/36
See application file for complete search history.

(56) References Cited

U.S. PATENT DOCUMENTS

| | | | | |
|---|---|---|---|---|
| 6,219,829 | B1 * | 4/2001 | Sivakumar | G06F 11/3664 714/E11.208 |
| 8,121,618 | B2 | 2/2012 | Rhoads et al. | |
| 8,121,874 | B1 | 2/2012 | Guheen et al. | |
| 2006/0080649 | A1 * | 4/2006 | Eden | G06F 9/445 717/168 |
| 2008/0040732 | A1 * | 2/2008 | Akiyama et al. | 719/328 |

(Continued)

OTHER PUBLICATIONS

Ferrer et al., Evolutionary Algorithm for Prioritized Pairwise Test Data Generation, 2012.*

(Continued)

*Primary Examiner* — Wei Zhen
*Assistant Examiner* — Zhan Chen
(74) *Attorney, Agent, or Firm* — Nutter McClennen & Fish LLP; David J. Powsner; Joshua I. Rudawitz

(57) ABSTRACT

The invention provides, in one aspect, a digital data processor-based test data generator, that includes a digital data processing system with one or more digital data processors that are coupled for communications. A scenario creator executes on the digital data processing system and accepts, for each of one or more entities ("domains"), a plurality of parameters, including a hierarchical relationship between that entity and one or more other entities, a priority-of-test-data-creation relationship between that entity and one or more entities, and one or more attributes of that entity. The scenario creator generates a parameter set that defines a test data set specifying the aforesaid entities, relationships and attributes. The test generator further includes an engine that enumerates values for the entities and their attributes in an order determined by the aforesaid relationships.

18 Claims, 26 Drawing Sheets

(56) References Cited

U.S. PATENT DOCUMENTS

| | | | |
|---|---|---|---|
| 2008/0120330 A1 | 5/2008 | Reed et al. | |
| 2008/0120593 A1* | 5/2008 | Keren .................. | G06F 9/4443 |
| | | | 717/105 |
| 2010/0229150 A1* | 9/2010 | Stone et al. .................. | 717/104 |
| 2011/0035205 A1* | 2/2011 | Brideson .................. | G06F 8/35 |
| | | | 703/22 |
| 2011/0246528 A1* | 10/2011 | Hsieh ................ | G06F 17/30516 |
| | | | 707/791 |

OTHER PUBLICATIONS

International Search Report and Written Opinion for PCT Application No. PCT/US13/35620 mailed Aug. 15, 2013 (14 pages).

\* cited by examiner

SYSTEMS AND METHODS FOR DATA GENERATION

This application claims the benefit of filing of U.S. Patent Application No. 61/621,723, filed Apr. 9, 2012, the teachings of which are incorporated by reference herein.

BACKGROUND OF THE INVENTION

The invention pertains to digital data processing and, more particularly, for example, to methods and apparatus for the generation of data. The invention has application, by way of non-limiting example, in test harnesses, unit test models, integration testing, black/white box testing, data modeling, and so forth.

Test data generation is a process of generating random or specific data used to test the validity of software coding business logic. In general, during a testing procedure, the generated data is consumed by code that contains the specific business logic that needs to be tested. By using the generated test data, the code containing the business logic is expected to produce a predictable result. Once the code containing the business logic has completed its instructions using the generated test data, one or more assertions are made and compared to the predictable data result. If the assertions return true then the business logic code is deemed to be correct. If the assertions return false, then the business logic code needs correcting.

There are three primary categories of testing from which most other categories of testing derive, unit, integration and functional. All three primary categories require test data in order to assert that the code business logic is producing a predictable result.

Unit testing generally tests very small, specific units of code and normally requires small sets of test data be generated in order to test assertions on the specific unit of code. However, the specific unit of code may be dependant on other units of code having test data generated and executed prior to testing the given unit of code.

Integration testing generally tests larger units of code that are integrated together to produce a predictable data result from combined business logic. Integration tests generally require larger and more complex test data to be generated in order to assert that a combined set of business logic is producing predictable data results.

Functional testing generally tests how a specific portion of a software application interface behaves given a specific set of data. Functional tests may require small to large sets of test data in order to assert that a specific portion of the application interface is behaving as predicated.

In general test data generation for unit, integration and functional testing is done in one of three primary ways: manually, programmatically or via data pruning.

Manually generated test data is created by manually entering test data into a file of some sort via a computer keyboard. In general, this type of test data is entered into a CSV or an Excel spreadsheet. Manually entering test data in general is inefficient, prone to human error, time consuming and limited in the amount and complexity of test data that can be created, thus limiting the amount and complexity of code that can be effectively tested.

Programmatic generated test data is created by executing a software program written to produce a random or specific set of test data. Programs written to produce random or specific sets of test data are only marginally better at producing test data than those done manually. While a given test data generation program may produce larger sets of test data, writing code and maintaining code to generate a specific set of test data, while less error prone is, in general, just as time consuming and limited in complexity as producing test data manually.

Data pruning is the process of generating test data by pruning a subset of data from a production data set. Production data is the resulting data that is produced from live software applications in a production environment. There are many challenges that arise from pruning a production data set, including:

Confidential data (e.g. social security number, credit card number, etc.) must be encrypted, modified, replaced or removed from the data set. Even when software programs are used to prune confidential data, it is often time consuming and may not catch and prune all confidential data from a given data set.

Negative or conditional testing with production data is very difficult at best to accomplish because production data, in general, is not predictable.

Code and business logic may not be testable before said code is introduced into the production environment because production data has not been produced to test the given code business logic.

In summary and in general, manually generated test data, programmatic specific test data generation and pruning of production data to yield clean test data, all have limiting, finite qualities in their ability to produce and maintain complex test data. These limitations directly and adversely affect the usefulness and validity of unit, integration and functional testing and other derivations of these testing paradigms.

SUMMARY OF THE INVENTION

The foregoing are among the objects attained by the invention which provides, in one aspect, a digital data processor-based test data generator, that includes a digital data processing system with one or more digital data processors that are coupled for communications. A scenario creator executes on the digital data processing system and accepts, for each of one or more entities ("domains"), a plurality of parameters, including a parameter specifying a hierarchical relationship between that entity and one or more other said entities, a parameter specifying a priority-of-test-data-creation relationship between that entity and one or more entities, and one or more parameters specifying attributes of that entity. The scenario creator generates a parameter set that defines a test data set specifying the aforesaid entities, relationships and attributes.

The test generator further includes an engine that executes on the digital data processing system and that responds to the parameter set by generating the test data set by enumerating values for the entities and their attributes in an order determined by the aforesaid relationships. The test data set can be applied, for example, to a software program to be tested that also executes, for example, on the digital data processing system.

Related aspects of the invention provide a test data generator, e.g., as described above, in which the scenario creator accepts as input/output sequence specifiers for the entities. Further related aspects of the invention provide such a test data generator in which parameters accepted by the scenario creator include the identity of a software component ("generator") suitable for enumerating test data for a given attribute, and the identity of a further software component ("receiver") suitable for formatting test data generated by a generator for application to the program being tested.

Further related aspects of the invention provide a test data generator, e.g., as described above, in which the scenario creator accepts user input that can include, for example, a drag-and-drop operation specifying attributes of entities and/or hierarchical relationships between them.

Other related aspects of the invention provide a test data generator, e.g., as described above, in which the engine generates the test data set by enumerating values for entities that the input parameters indicate are higher in the hierarchy before entities that are lower in the hierarchy.

In related aspects of the invention, the engine enumerates values for entities having a higher priority-of-test-data-creation before entities having a lower priority-of-test-data-creation.

And, in further related aspects of the invention, the engine enumerates values for entities that are siblings in the hierarchical relationship such that value(s) for a sibling having a lower sequence specifier is/are generated before value(s) for a sibling having a higher sequence specifier.

In yet still further related aspects of the invention, the engine can generate the test data set by enumerating values for entities that are siblings in the hierarchical relationship such that values for a sibling having a lower sequence specifier are generated before values for a sibling having a higher sequence specifier.

Yet other related aspects of the invention provide a test data generator, e.g., as described above, in which the engine utilizes generators and receivers, if any, specified for each attribute to generate those values.

The invention provides, in still other aspects, systems for data generation that are useable in test harnesses, unit test models, integration testing, black/white box testing, data modeling, to name a few. Such systems can include a backend component that allows the modeling, management and/or creation of data. They can, further, include a frontend component, e.g., providing a user interface that hides the complex intricacies of the backend and that allows for modeling, management and/or creation of data, e.g., in real-time or otherwise, locally, remotely or otherwise.

Other aspects of the invention provide methods paralleling operation of the test data generator and systems described above.

BRIEF DESCRIPTION OF THE DRAWINGS

A more complete understanding of the invention maybe attained by reference to the drawings, in which.

DETAILED DESCRIPTION OF THE ILLUSTRATED EMBODIMENT

Described and illustrated below are systems and methods for data generation in accord with the invention. These are useable in test harness, unit test models, integration testing, black/white box testing, and data modeling applications, to name a few.

The systems and methods described below can be implemented on a conventional digital data processing system (e.g., comprising one or more of a mainframe, mini computer, desktop computer, laptop, handheld, and so forth, networked or otherwise) of the type commercially available in the art that is programmed in accord with the teachings hereof.

Figure 1:
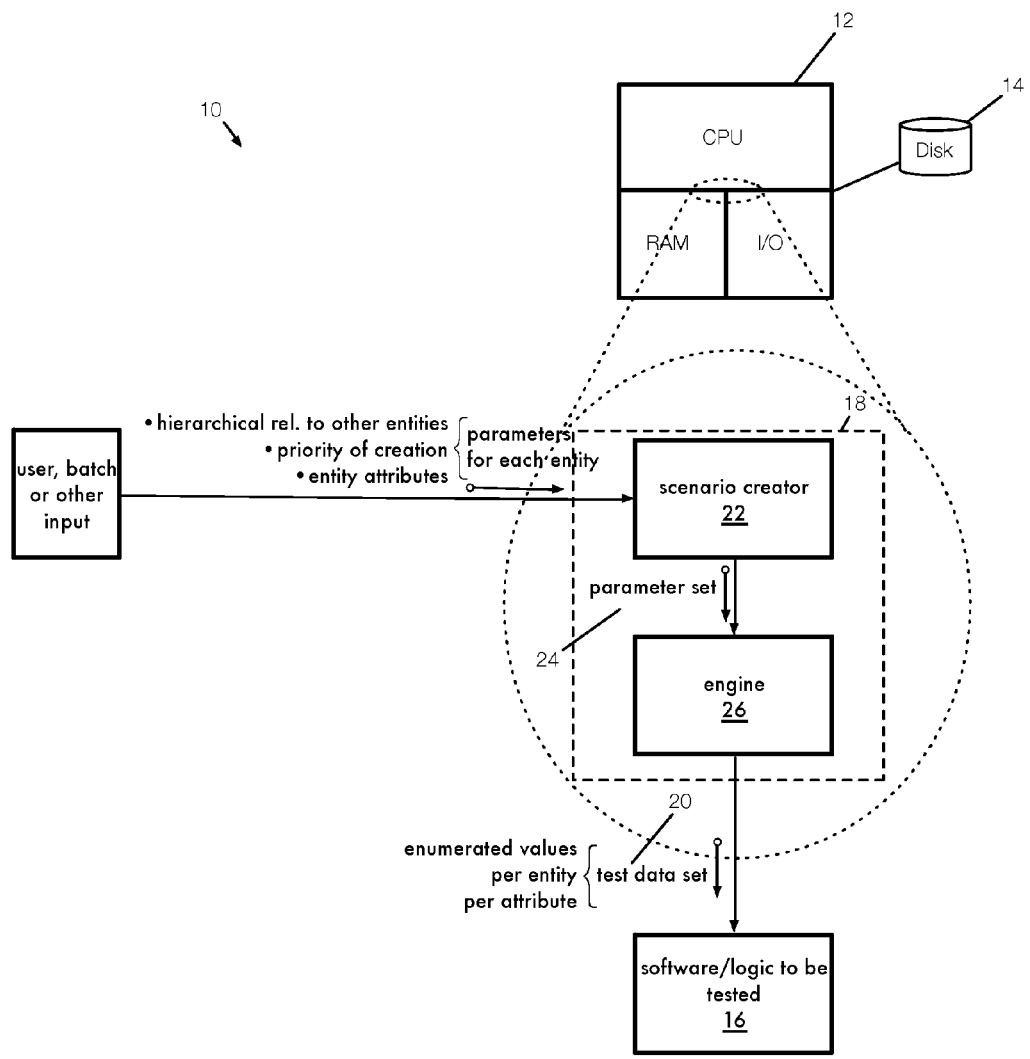
FIG. 1 depicts a system according to one practice of the invention.

Thus, for example, FIG. 1 depicts a digital data processing system 10 according to one practice of the invention. The illustrated system 10 includes a digital data processor 12 of the type commercially available in the marketplace, as adapted in accord with the teachings hereof. The digital data processor 12 includes central processing (CPU), dynamic memory (RAM) input/output (I/O), and static memory (disk) subsections, each of the type conventionally used in a digital data processor, albeit storing and/or executing a software program 16 to be tested (which may be of the type now or heretofore known in the art) and software or other logic 18 that generates data in support of such testing and that is constructed and operated in accord with the teachings hereof.

Although shown and discussed herein as operating on a single digital data processor, i.e., 12, it will be appreciated that the program 16 to be tested, the logic 18 that supports such testing, and/one or more constituent pieces of either thereof can execute on one or more other digital data processors (not shown) that are coupled for communications with each other and/or with the digital data processor 12 in the conventional manner in the art, as adapted in accord with the teachings hereof. Thus, by way of non-limiting example, the test data generation logic 18 may execute on digital data processor 12 and may generate and transmit to another digital data processor (not shown) a test data set 20 for use in testing program 16 executing thereon. Moreover, by way of further non-limiting example, a scenario creator component 22 of test generation logic 18 may execute on digital data processor 12 and may generate and transmit a parameter set 24 for use by an engine component 26 of test generation logic 18 for use in generating the test data set 20 that, in turn, is used in testing program 16, where the engine 26 and/or program 16 execute on one or more other digital data processors.

In the illustrated embodiment, both program 16 and generator 18 comprise software. However, in other embodiments, one or both of them (or constituent components thereof) may comprise firmware, hardware or other logic, all consistent with the teachings hereof.

Illustrated scenario creator 22 generates parameter set 24 that defines a test data set specifying entities, entity attributes, and entity relationships for which test data is to be generated. To that end, the generator 22 accepts as input parameters specifying, for each of one or more entities (e.g., persons, places and things) for which test data is to be generated, (i) one or more attributes of that entity, (ii) a hierarchical relationship between that entity and one or more other entities for which such data is to be generated, and (iii) a priority-of-test-data-creation relationship between that entity and one or more entities. In addition, the illustrated scenario creator 22 accepts sequence specifiers for the entities. Further examples of parameters accepted by the scenario creator 22 include the identity of a software component ("generator") suitable for enumerating test data for a given attribute, and the identity of a further software component ("receiver") suitable for formatting test data generated by such a generator for application to the program 16.

Input to the creator 22 can be provided by a user, e.g., via a web page or otherwise. While that input can be provided in the form of free text, radio button and/or checkbox selections, and so forth, it can also be indicated by way of drag-and-drop operations, e.g., as where the user executes a drag-and-drop operation to specify attributes of entities and/or hierarchical relationships between them. Input to the creator 22 can, as well or in addition, by input via a file or other data collection, e.g., as specified by such a user or otherwise. It can, instead or in addition, be provided via a batch or other process (not shown) executing on the same or another digital data processor as that upon which the creator 22 operates.

Illustrated engine 26 processes or otherwise responds to the parameter set 24 by generating a test data set 20 enumerating values for the entities and their attributes specified in the input to scenario creator 22 in an order determined by the specified relationships (i.e., the hierarchical entity relationship and/or the priority-of-test-data-creation relationship). Thus, for example, in the illustrated embodiment, the engine 26 generates the test data set by enumerating values for entities that the input parameters indicate are higher in the hierarchy before entities that are lower in the hierarchy. Likewise, it enumerates values for entities having a higher priority-of-test-data-creation before entities having a lower priority-of-test-data-creation. And, by way of further example, it enumerates values for entities that are siblings in the hierarchical relationship such that value(s) for a sibling having a lower sequence specifier is/are generated before value(s) for a sibling having a higher sequence specifier. And, by way of still further example, the engine 26 can generate the test data set 24 by enumerating values for entities that are siblings in the hierarchical relationship such that values for a sibling having a lower sequence specifier are generated before values for a sibling having a higher sequence specifier. The engine 26 of the illustrated embodiment utilizes the generators and receivers, if any, specified for each attribute to generate those values.

Figure 2:
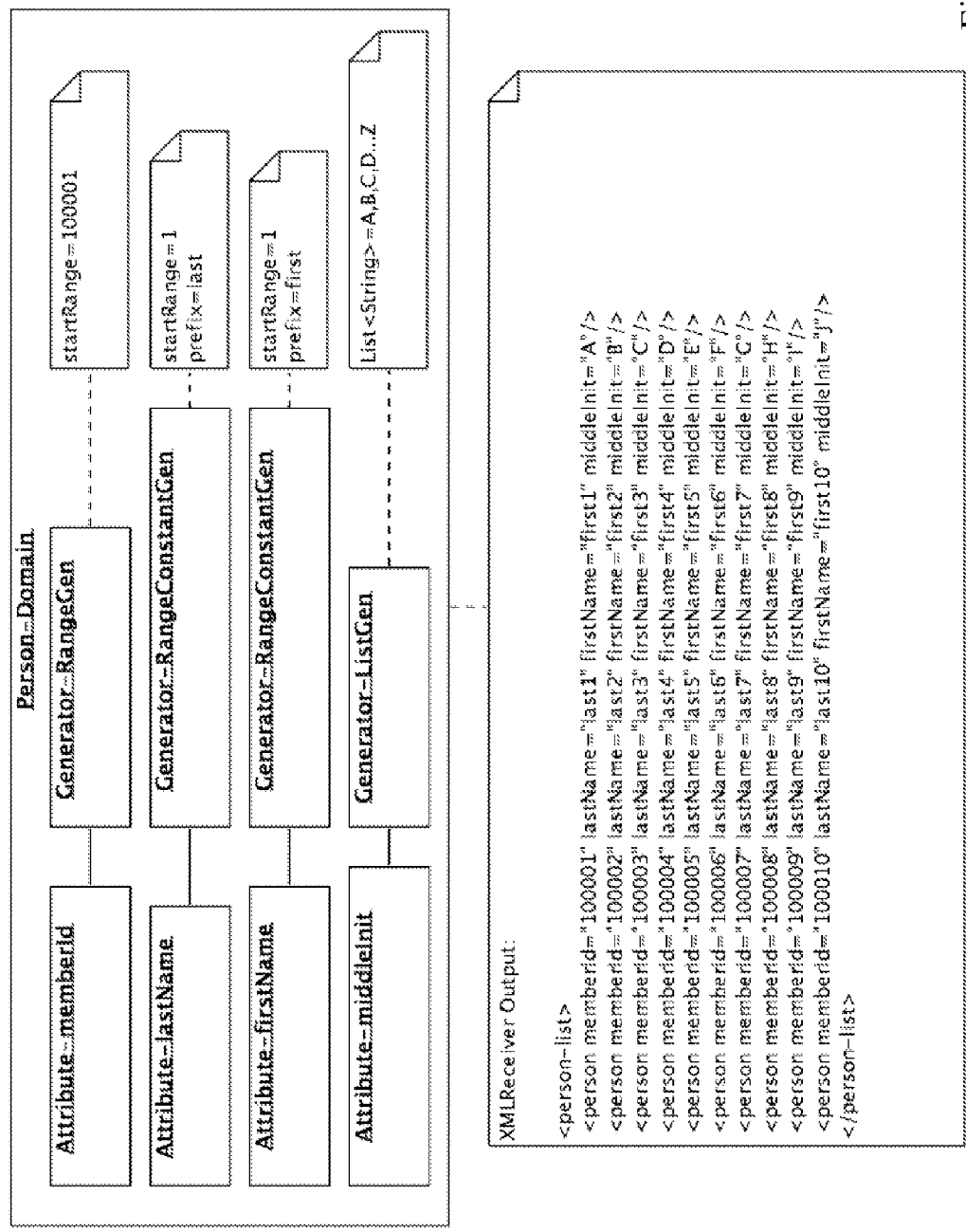
FIG. 2 depicts an object diagram that pictorially summarizes the basic objects that are acted upon by the scenario creator and engine of FIG. 1.

Referring to FIG. 2, there is shown an object diagram that pictorially summarizes the basic objects that are acted upon by the scenario creator 22 and engine 26 of FIG. 1, which are Domains, Attributes, Generators, Receivers and Scenarios. In this regard:

Domains define real word objects (e.g. a person, a store, a book, etc.). In the illustrated embodiment, domains are typically nouns: they describe a person place or thing.

Attributes are adjectives that describe aspects of a domain for which data is to be generated. For example a person domain might have attributes, ID, firstName, lastName and middleInitial; these are the adjectives that describe the noun, Person.

Generators are primitive classes that each generate a specific type of data. When a generator is assigned to an attribute, that attribute is able to produce/generate a specific type of data.

Receivers are classes that take delivery of a domain and morph the data generated from the domain's attributes into some usable form of test data.

Scenarios package one or more related domains to be processed by the "Engine" as one unique unit of work and define how much test data will be generated.

The Domain, in this example called Person, defines a set of Attributes. Each Attribute is assigned a Generator that determines how and what type of data will be generated. During data generation, each time the Domain is called, its set of Attributes are iterated over and the Attribute's generator generates a new value. The Domain's Attributes are then passed to any Receivers waiting to process the newly generated data.

More specifically, the object diagram of FIG. 2 shows a Person Domain that defines four Attributes and assigns to each Attribute a Generator that determines how values will be generated by the illustrated system. The Domain further is assigned an XMLReceiver that morphs the generated data into XLM formatted output. The Scenario defines a loop count of 10 on the Domain, which allows the engine to iterate over the Person Domain, its attributes and receiver 10 times, thus producing 10 rows of XML formatted test data.

The Scenario Creator

Described below with respect to FIGS. 3 through 12 is the operation of Scenario Creator 22 of FIG. 1. Those skilled in the art will appreciate that these are UML diagrams, each of which depicts a respective sequence of actions in a language-agnostic manner and that, thereby, facilitate making and/or using respective aspects of the illustrated embodiment. Those UML diagrams are summarized, in text, in the section that follows. It will be further appreciated that, although the diagrams and text pertain to a particular embodiment of the invention, other embodiments may utilize sequences of actions that vary from those shown and described here.

Figure 3:
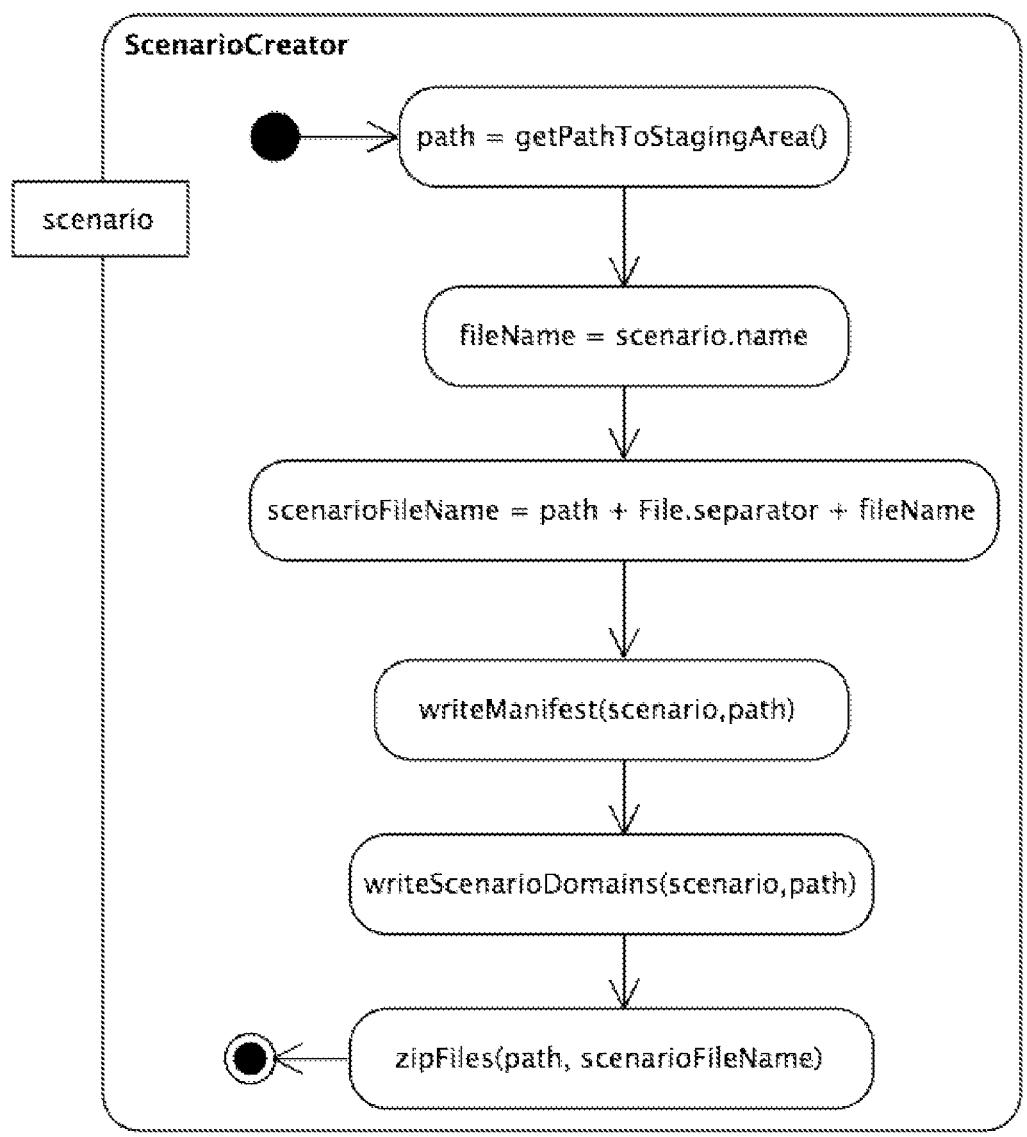
FIG. 3 depicts an activity diagram describing a sequence that governs the creation of a scenario file in a system according to one practice of the invention.

Referring to FIG. 3, ScenarioCreator, there is shown an activity diagram describing a sequence that governs the creation of a scenario file. From the sequence other methods are called that traverse the set of domains related to the given scenario, produce parameter files for each of them and finally package them into a file, the scenario file:

1. Get the path to the staging area where the file will be written,
2. define the name of a scenario file as the name of the scenario,
3. call writeManifest(scenario, path),
4. call writeScenarioDomains(scenario, path),
5. package the files in that path into the scenario file.

Figure 4:
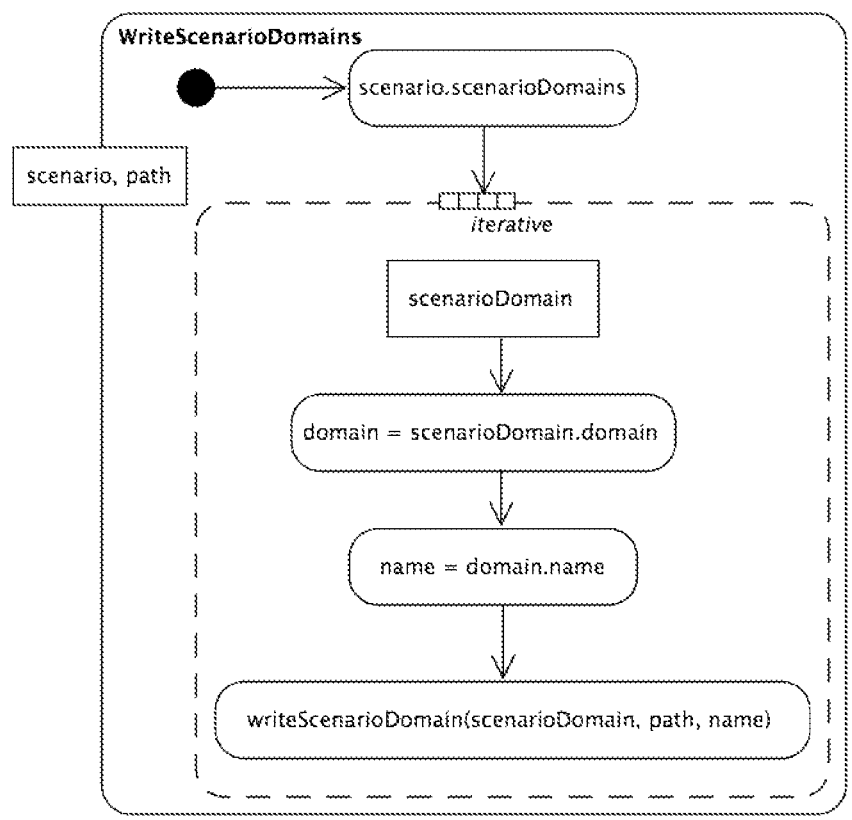
FIG. 4 depicts an activity diagram describing a process that governs the traversal of each domain within a given scenario and prepares that domain to be written to a file in a system according to one practice of the invention.

Referring to FIG. 4, WriteScenarioDomains, there is shown an activity diagram describing a process that governs the traversal of each domain within a given scenario and prepares that domain to be written to a file:

1. Get the set of ScenarioDomains from the Scenario,
2. iterate over each ScenarioDomain in the set,
3. get the name of the Domain,
4. call writeScenarioDomain(scenarioDomain, path, name).

Figure 5:
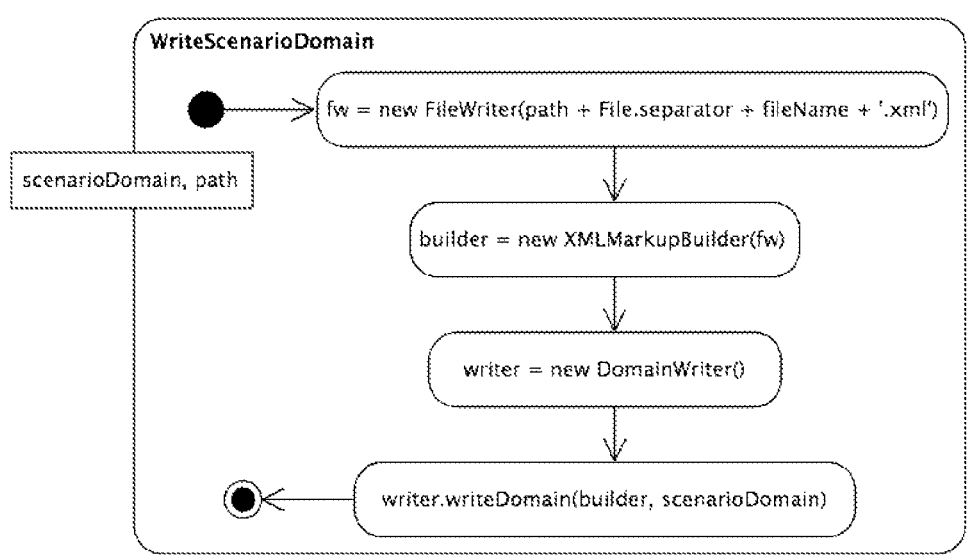
FIG. 5 depicts an activity diagram describing a process of creating a given domain's file and preparing it to be written to in a system according to one practice of the invention.

Referring to FIG. 5, WriteScenarioDomain, there is shown an activity diagram describing a process of creating a given domain's file and preparing it to be written to. From initial steps, objects are created and those objects are passed to another called method:

1. Define the path to store the file to be generated,
2. define the builder that creates the file,
3. define the DomainWriter which transfers the ScenarioDomain's description into the required file,
4. call writeDomain(builder, scenarioDomain)

Figure 6:
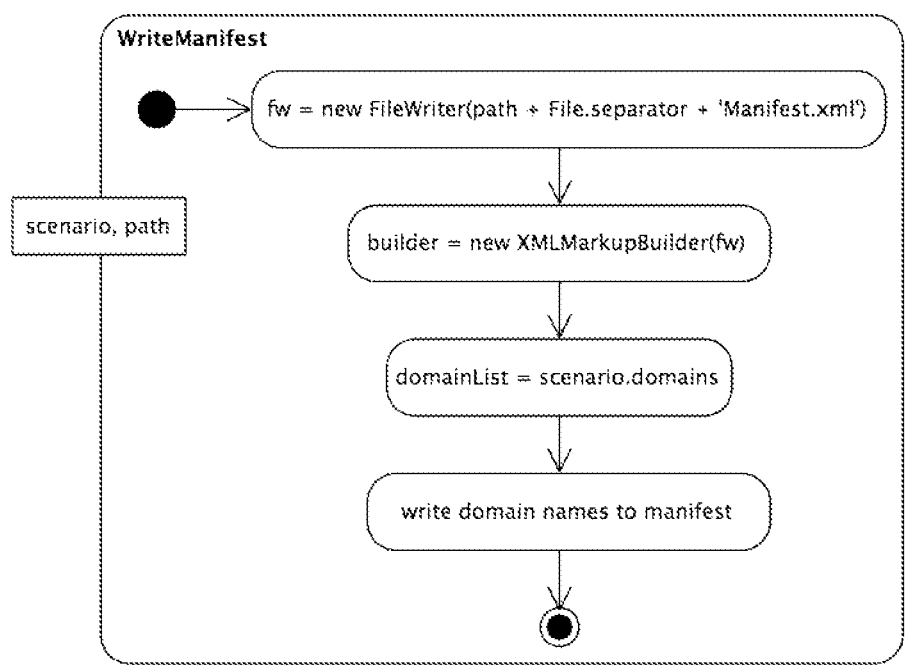
FIG. 6 depicts an activity diagram describing a process of writing the meta data about the Scenario to a manifest file in a system according to one practice of the invention.

Referring to FIG. 6, WriteManifest, there is shown an activity diagram describing a process of writing the list of domain names to a manifest file. From the initial steps, information is defined and then the manifest file is written to disk:

1. Define the path to store the manifest file,
2. define the builder that creates the manifest file,
3. retrieve the list of Domains from the Scenario,
4. write the domain names to the manifest.

Figure 7:
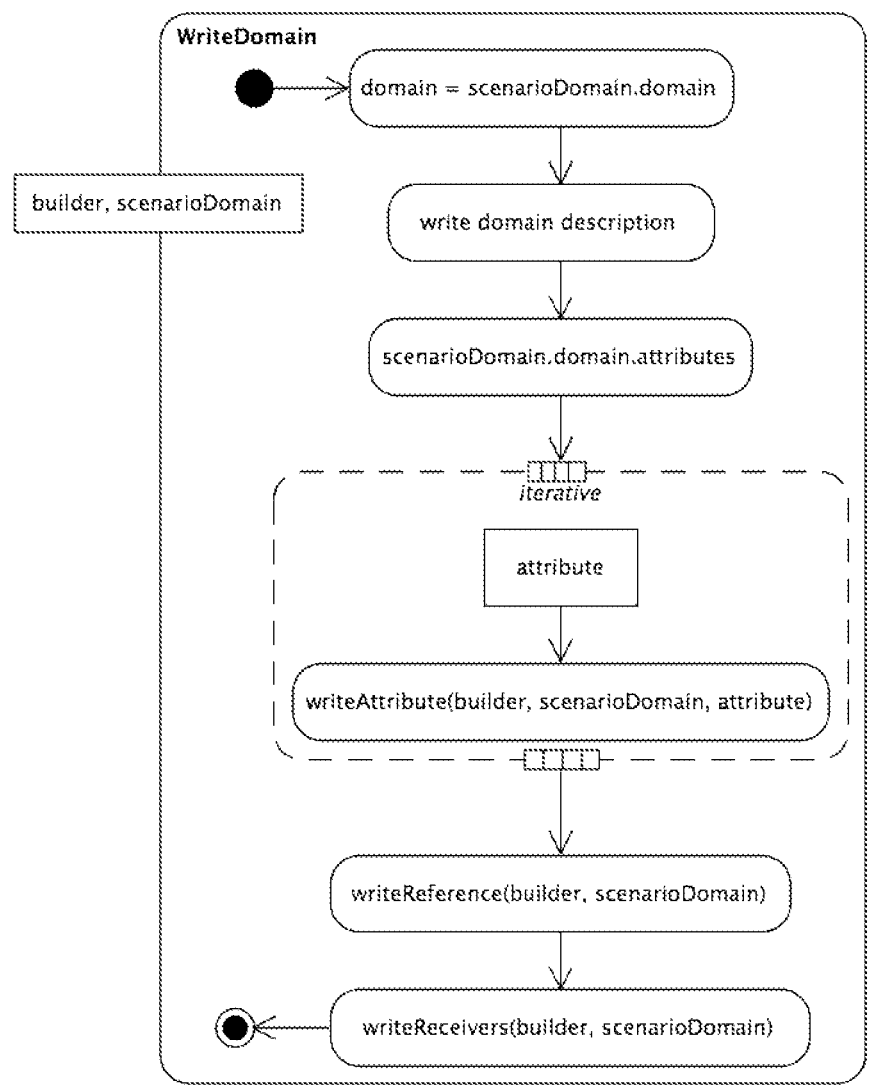
FIG. 7 depicts an activity diagram describing a process of writing the domain description in a system according to one practice of the invention.

Referring to FIG. 7, WriteDomain, there is shown an activity diagram describing a process of writing the domain description. From the initial steps, other methods are called that write descriptive information associated with the domain:

1. Retrieve the domain from the scenario,
2. write the domain description,
3. iterate over the domain's attributes,
4. call writeAttribute(builder, scenarioDomain, attribute),
5. after iteration complete, call writeReference(builder, scenarioDomain),
6. call writeReceivers(builder, scenarioDomain).

Figure 8:
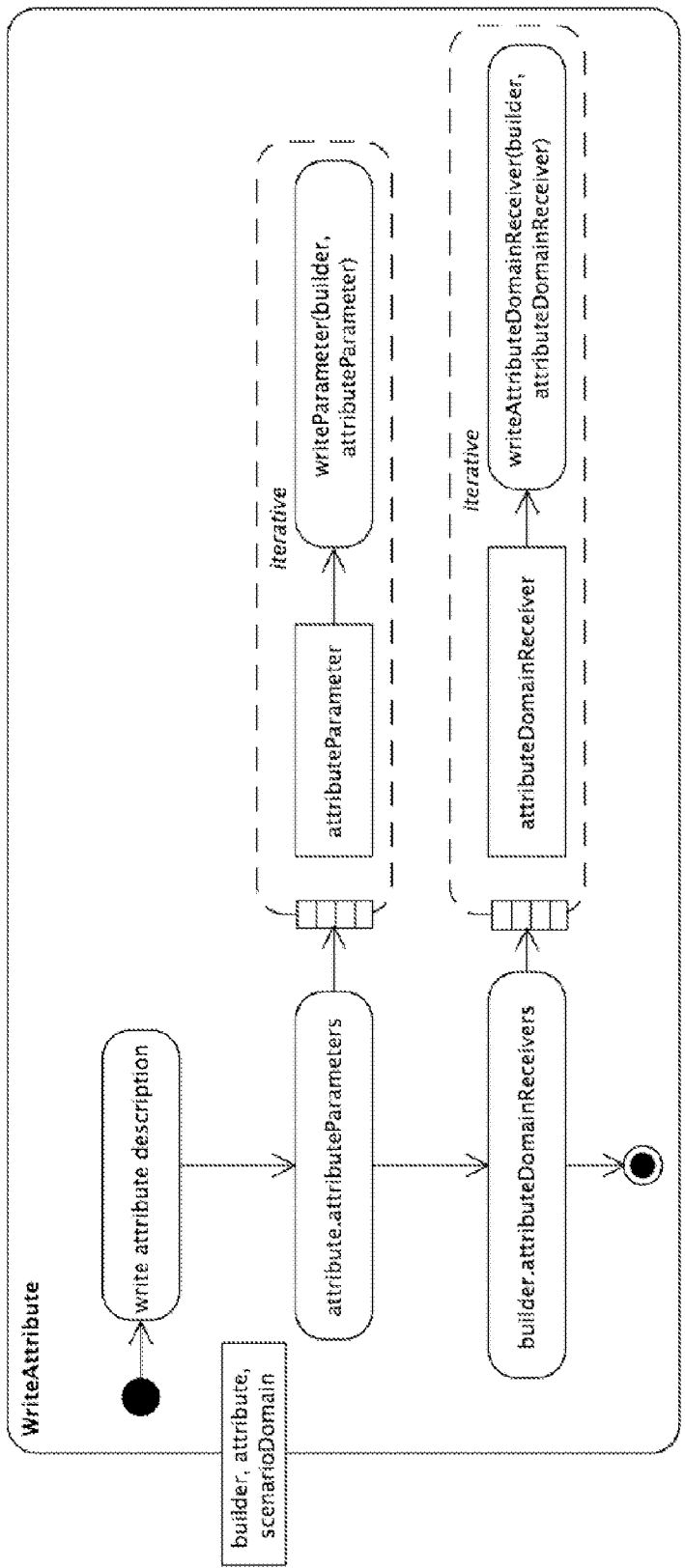
FIG. 8 depicts an activity diagram describing a process of writing the Attribute description in a system according to one practice of the invention.

Referring to FIG. 8, WriteAttribute, there is shown an activity diagram describing a process of writing the Attribute description. From the initial steps, other methods are called that write information associated with the attribute:

1. Write the attribute description,
2. iterate over the attribute's AttributeParameters,
3. for each AttributeParameter, call writeParameter (builder, attributeParameter),
4. for each AttributeDomainReceiver, call writeAttributeDomainReceiver(builder, attributeDomainReceiver).

Figure 9:
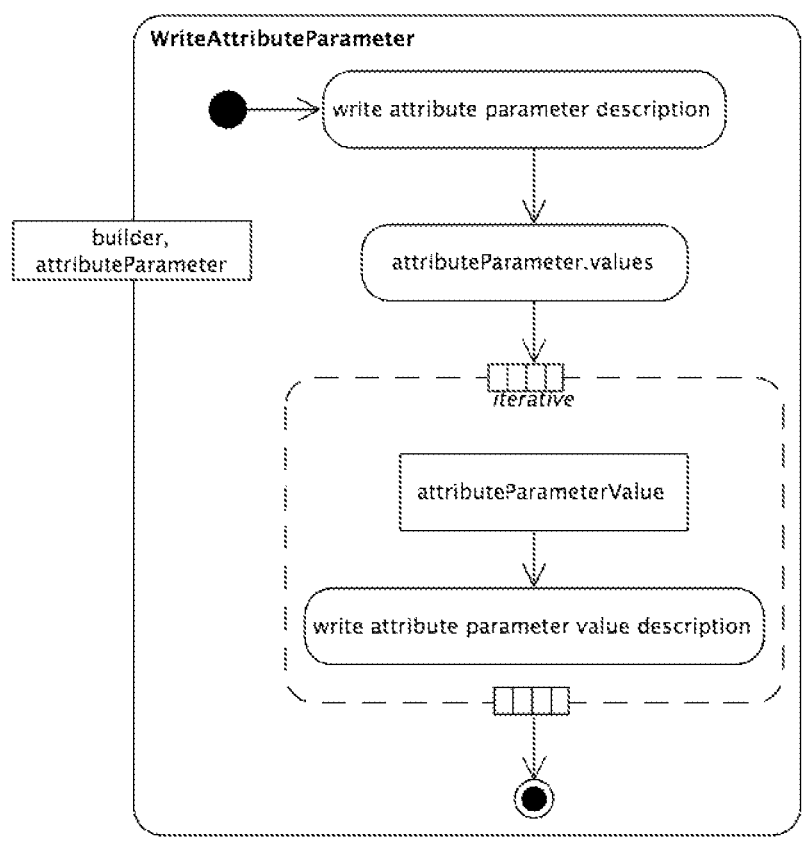
FIG. 9 depicts an activity diagram describing a process of writing the AttributeParameter description and AttributeParameterValues in a system according to one practice of the invention.

Referring to FIG. 9, WriteAttributeParameter, there is shown an activity diagram describing a process of writing the AttributeParameter description and the AttributeParameter's AttributeParameterValues:

1. Write the AttributeParameter description,
2. iterate over each AttributeParameterValue,
3. write the AttributeParameterValue description.

Figure 10:
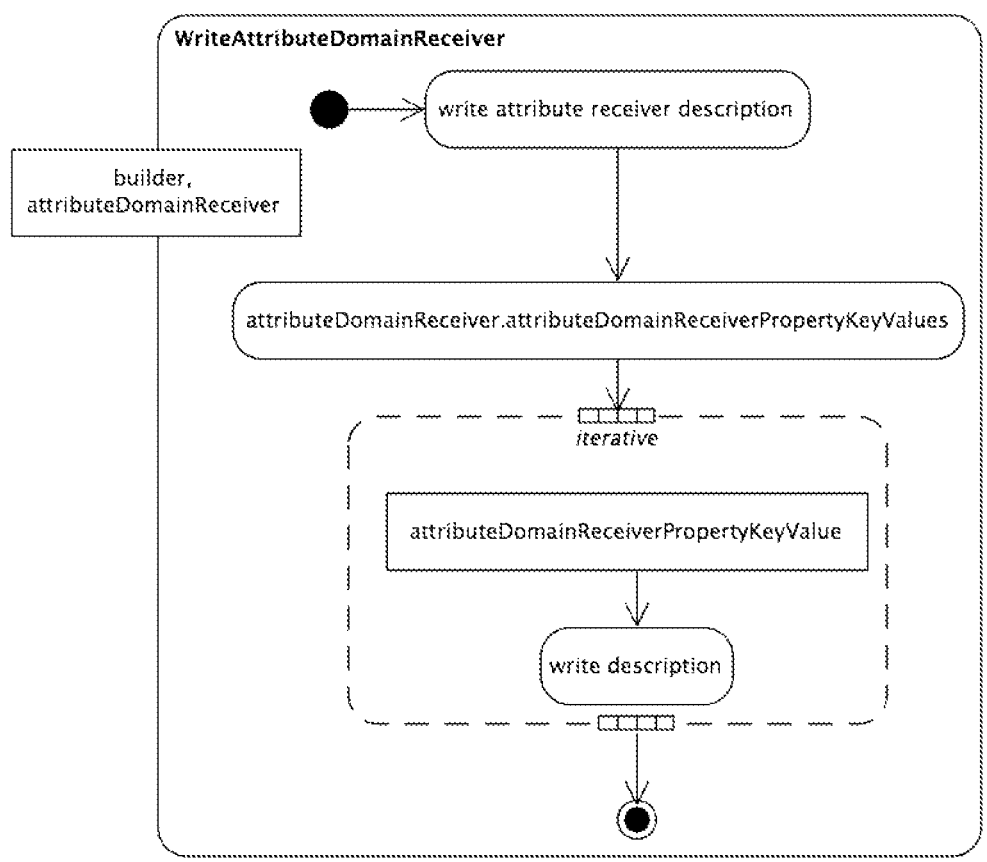
FIG. 10 depicts an activity diagram describing a process of writing the AttributeDomainReceiverdescription and the associated AttributeDomainReceiverPropertyKeyValues description in a system according to one practice of the invention.

Referring to FIG. 10, WriteAttributeDomainReceiver, there is shown an activity diagram describing a process of writing the AttributeDomainReceiver description and the associated AttributeDomainReceiverPropertyKeyValues description:

1. Write the AttributeDomainReceiver description,
2. iterate over each AttributeDomainReceiverPropertyKeyValues,
3. write each AttributeDomainReceiverPropertyKeyValue description.

Figure 11:
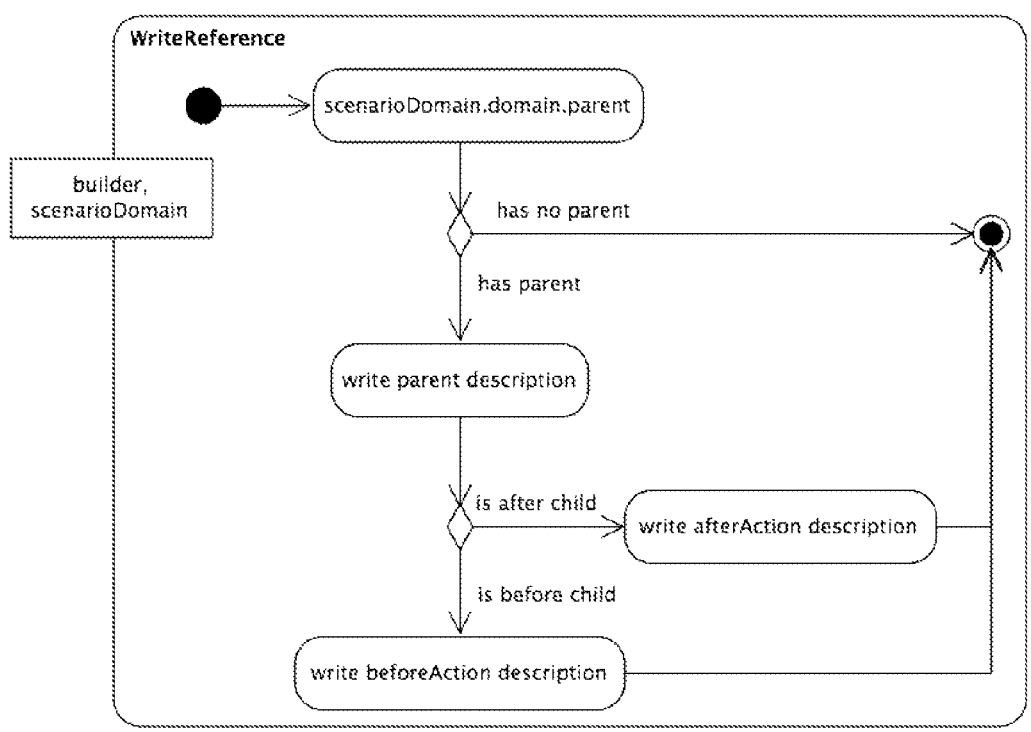
FIG. 11 depicts an activity diagram describing a process of writing the before and after action references in a system according to one practice of the invention.

Referring to FIG. 11, WriteReference, there is shown an activity diagram describing a process of writing the before and after action references:

1. Retrieve the parent of the ScenarioDomain's Domain, if available,
2. if parent exists, write the parent reference description,
3. if parent exists, and is an after child, write afterAction description,
4. if parent exists, and if a before child, write beforeAction description.

Figure 12:
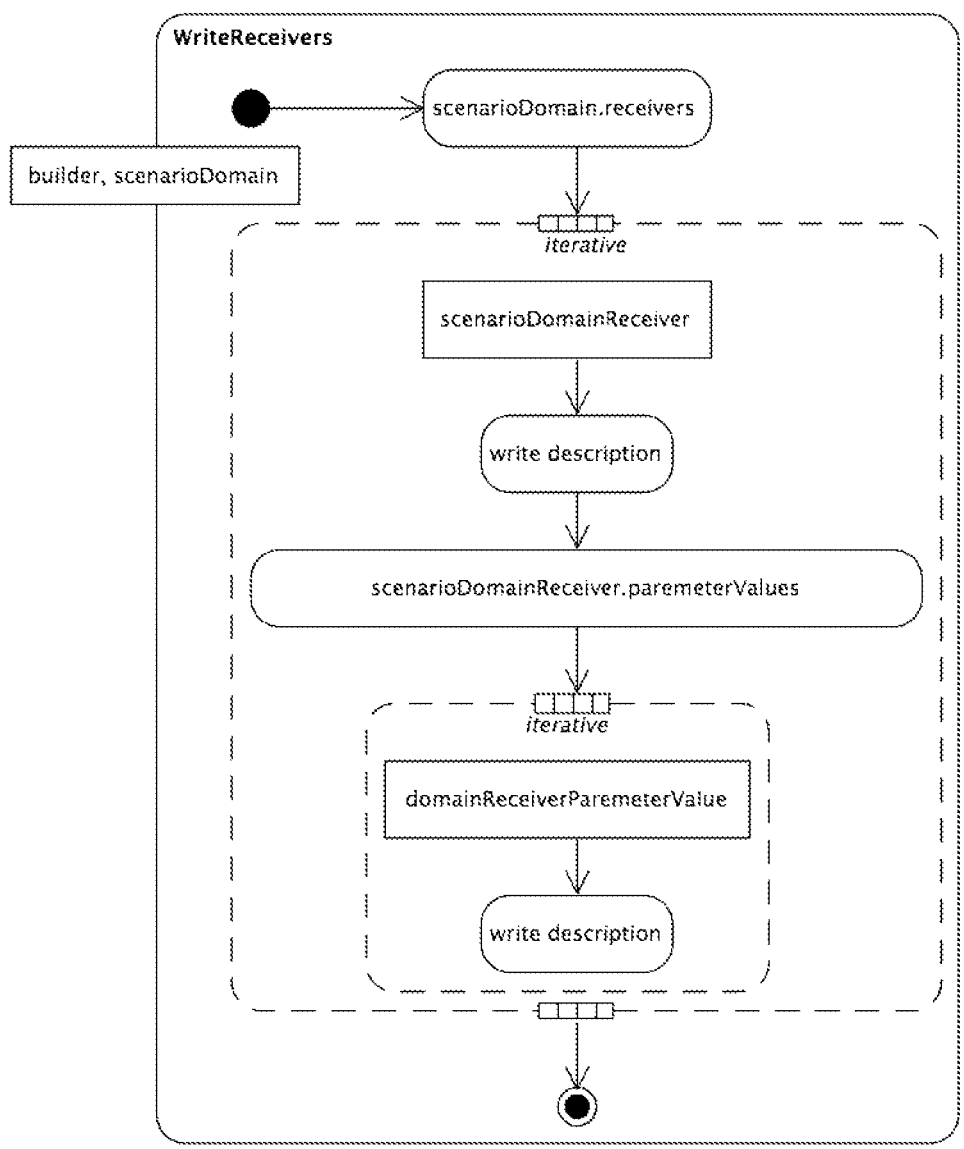
FIG. 12 depicts an activity diagram describing a process of writing the ScenarioDomainReceiver descriptions as well as the ScenarioDomainReceiver's DomainReceiverParameterValue descriptions in a system according to one practice of the invention.

Referring to FIG. 12, WriteReceivers, there is shown an activity diagram describing a process of writing the ScenarioDomainReceiver descriptions as well as the ScenarioDomainReceiver's DomainReceiverParameterValue descriptions:
1. Iterate over each ScenarioDomainReceiver,
2. write the ScenarioDomainReceiver description,
3. iterate over each DomainReceiverParameterValue,
4. write the DomainReceiverParameterValue description.

The Engine

Described below with respect to FIGS. 13 through 25, is the operation of engine 26 of FIG. 1. As above, those skilled in the art will appreciate that these are UML diagrams, each of which depicts a respective sequence of actions in a language-agnostic manner and that, thereby, facilitate making and/or using respective aspects of the illustrated embodiment. Those UML diagrams are summarized, in text, in the section that follows. And, as above, it will be further appreciated that, although the diagrams and text pertain to a particular embodiment of the invention, other embodiments may utilize sequences of actions that vary from those shown and described here.

Figure 13:
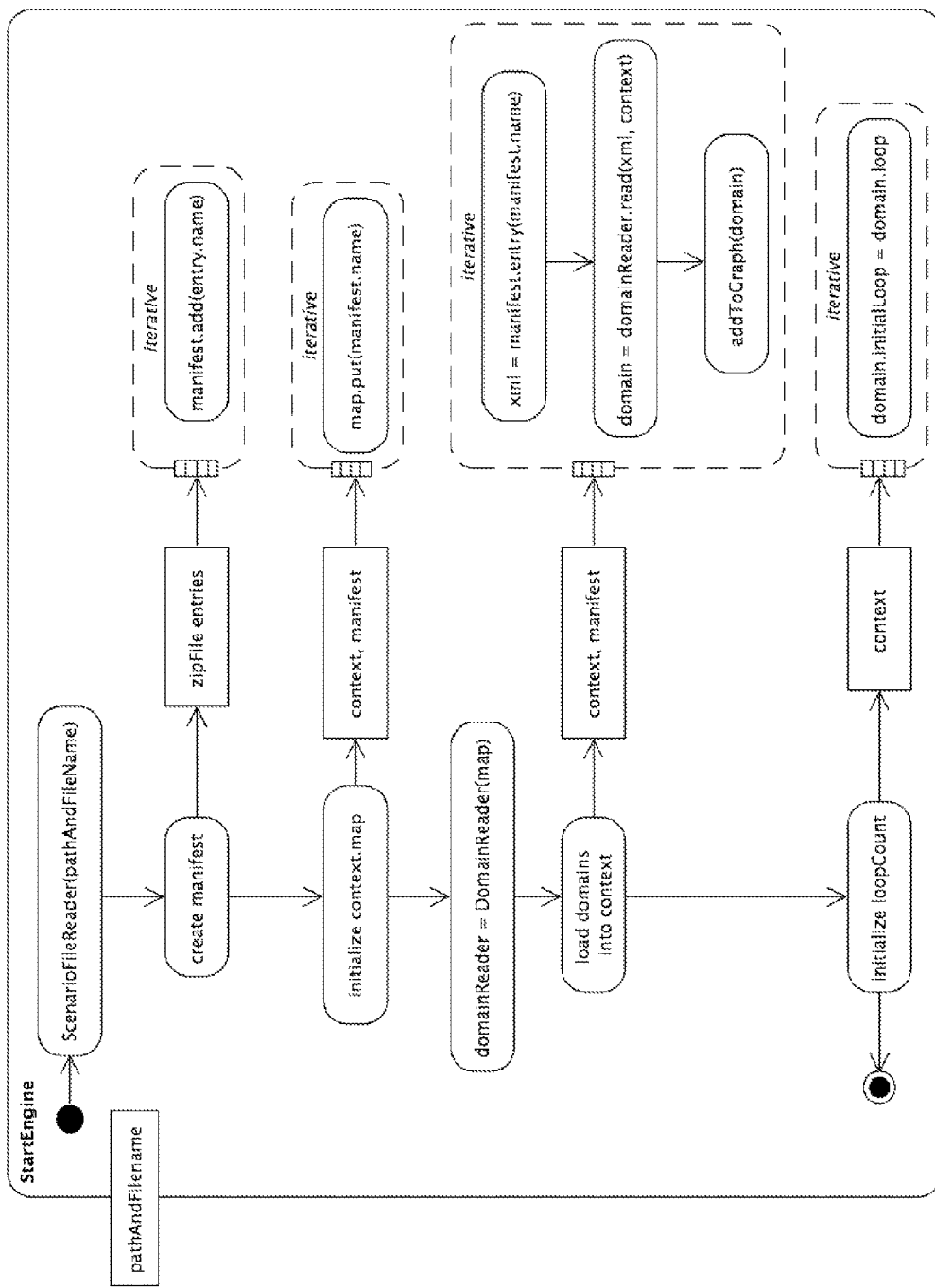
FIG. 13 depicts an activity diagram describing a StartEngine sequence in a system according to one practice of the invention.

Referring to FIG. 13, StartEngine, there is shown an activity diagram describing a start engine sequence. The start engine sequence utilizes the path and filename of the scenario file to load and performs the following operations:
1. Instantiates an ScenarioFileReader,
2. traverses each file within the scenario file and adds its name to the manifest,
3. traverses the manifest and adds each file name to a map,
4. traverses each domain name added to the map,
5. traverses the map and reads the description of each domain into memory,
6. traverses the map and initializes the loop count of each domain.

Figure 14:
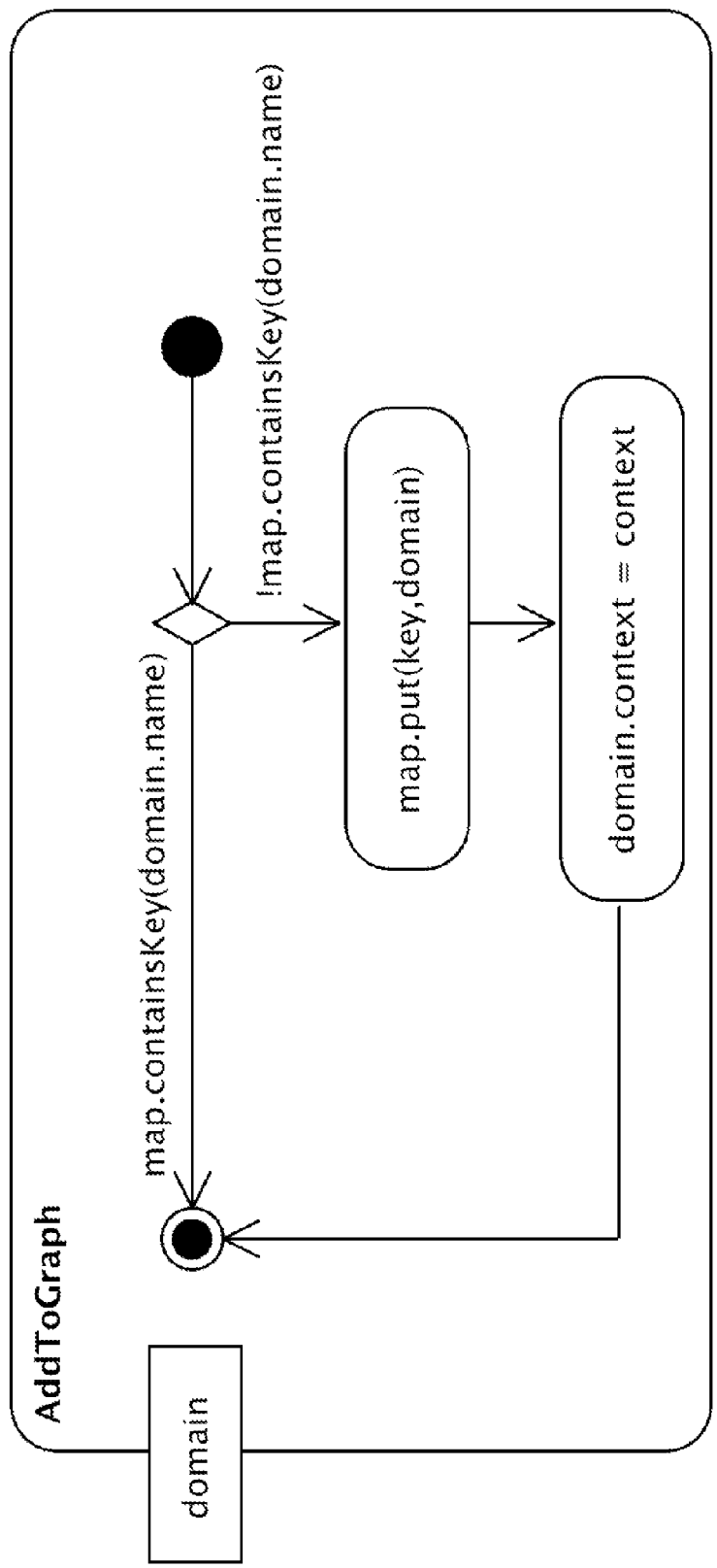
FIG. 14 depicts an activity diagram of describing an AddToGraph action within the Start Engine activity diagram in a system according to one practice of the invention.

Referring to FIG. 14, AddToGraph, there is shown an activity diagram describing an addToGraph action within the Start Engine activity diagram:
1. Checks to see if the domain has already been added to the map,
2. adds the domain to the map if it has not been added,
3. the domain's context references the engine's context.

Figure 15:
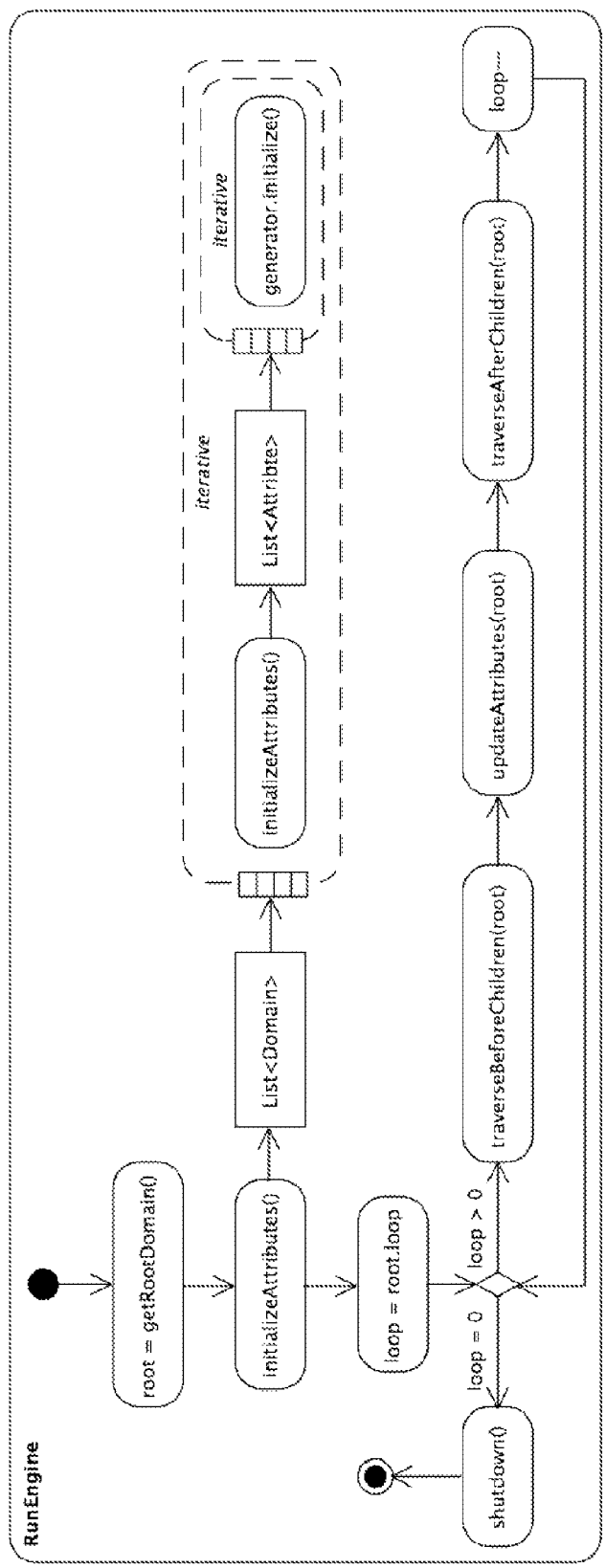
FIG. 15 depicts an activity diagram describing a recursive traversal engine that performs a sequence of instructions to generate test data in a system according to one practice of the invention.

Referring to FIG. 15, Run Engine, there is shown an activity diagram describing a recursive traversal engine that performs a sequence of instructions to generate test data:
1. Locate the root domain within the set of domains,
2. traverse each domain and on each domain,
   a. traverse each attribute and initialize its generator,
3. looping over the root domain,
   a. call traverseBeforeChildren(root),
   b. call updateAttributes(root),
   c. call traverseAfterChildren(root),
4. when it's done looping over the root domain, it performs shut down operations.

Figure 16:
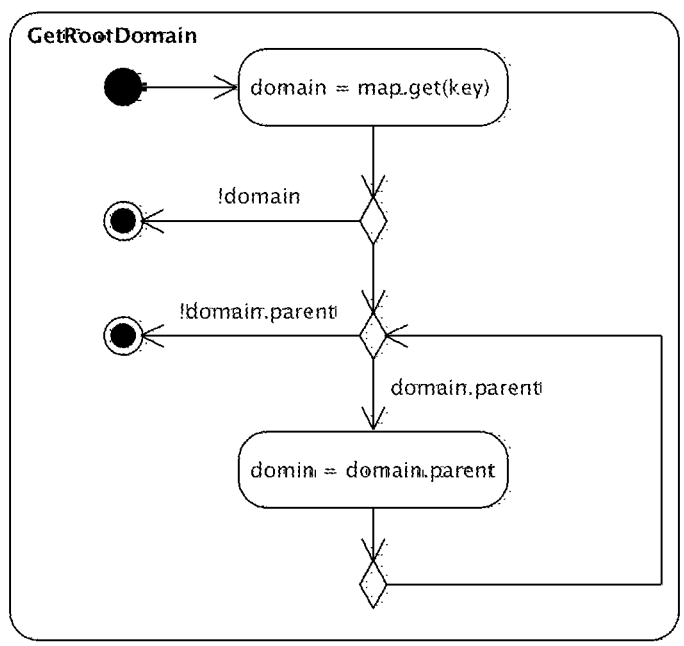
FIG. 16 depicts an activity diagram describing the GetRootDomain action within a Run Engine activity in a system according to one practice of the invention.

Referring to FIG. 16, GetRootDomain, there is shown an activity diagram describing a getRootDomain action within the Run Engine activity diagram that determines and retrieves the root domain from the set of domains:
1. Retrieve the domain from the given key/name of the domain,
2. if the key was not the name of a domain, then perform no action,
3. if the domain has no parent, it is the root domain; so return it,
4. if the key was the name of a domain and the domain has a parent, then get the parent and return to step 3.

Figure 17:
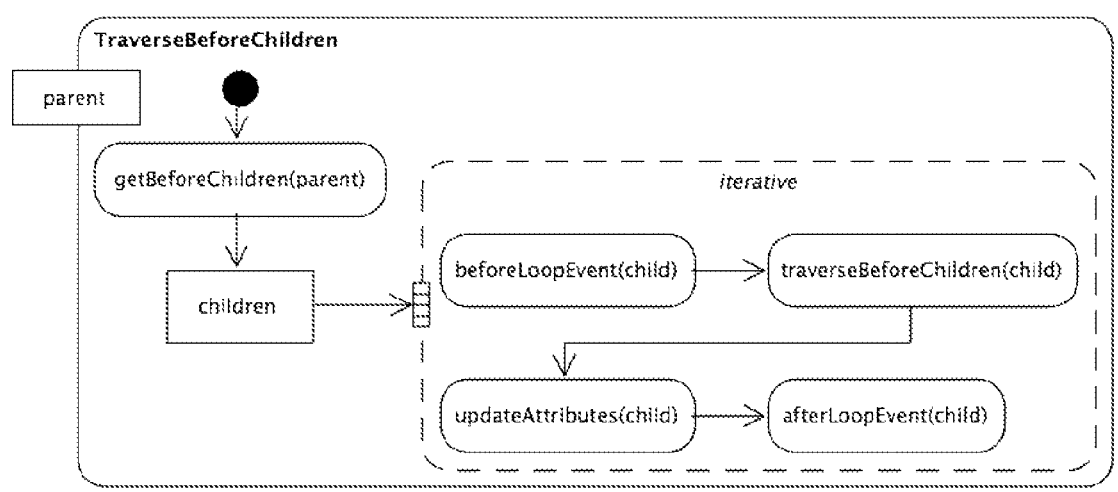
FIG. 17 depicts an activity diagram describing a TraverseBeforeChildren action within a Run Engine activity diagram in a system according to one practice of the invention.

Referring to FIG. 17, TraverseBeforeChildren, there is shown an activity diagram describing a traverseBeforeChildren action within the Run Engine activity diagram that traverses child domains of the given parent domain to generate data on child domain attributes prior to generating data on the parent's attributes:
1. Get the list of before child domains,
2. for each child
   a. execute its beforeLoopEvent(child),
   b. call traverseBeforeChildren(child),
   c. call updateAttributes(child),
   d. execute its afterLoopEvent(child).

Figure 18:
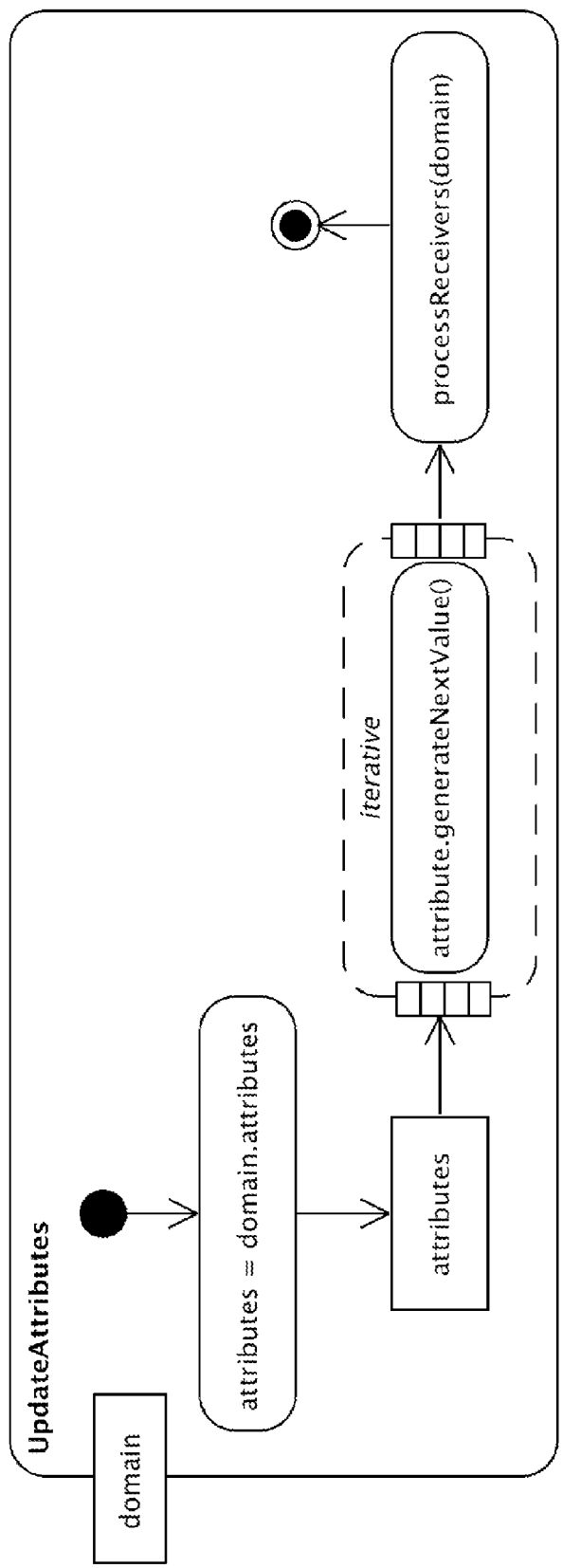
FIG. 18 depicts an activity diagram describing an UpdateAttributes action within RunEngine, TraversBeforeChildren and TraverseAfterChildren activity diagrams in a system according to one practice of the invention.

Referring to FIG. 18, UpdateAttributes, there is shown an activity diagram describing a updateAttributes action within the RunEngine, TraverseBeforeChildren and TraverseAfterChildren activity diagrams, which executes the generator on each attribute of a given domain:
1. For each attribute
   a. call its generator to generate its next value,
2. call, processReceivers(domain)

Figure 19:
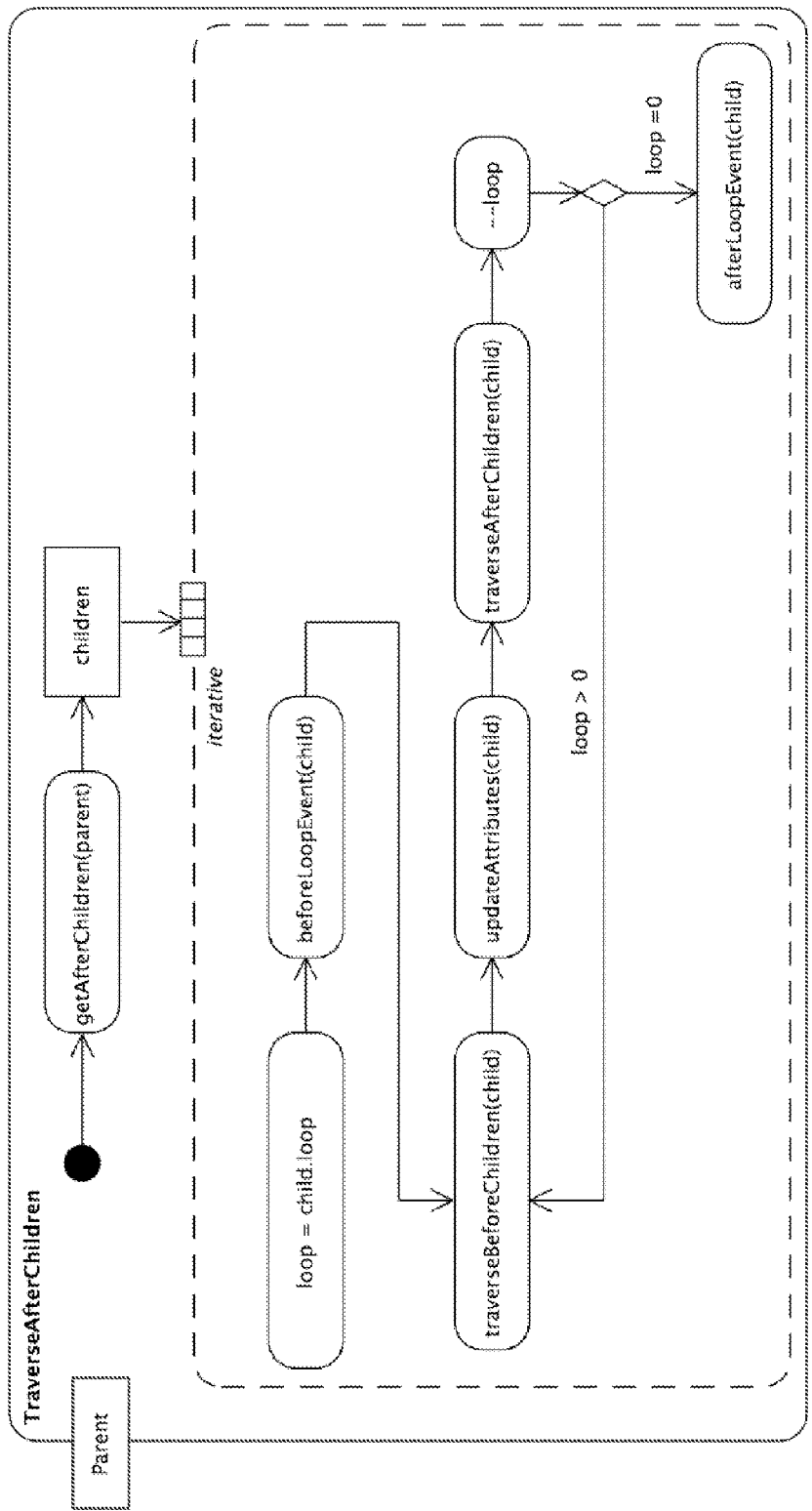
FIG. 19 depicts an activity diagram describing a TraverseAfterChildren action within a Run Engine activity diagram in a system according to one practice of the invention.

Referring to FIG. 19, TraverseAfterChildren, there is shown an activity diagram describing a TraverseAfterChildren action within the Run Engine activity diagram that traverses child domains of the given parent domain to generate data on child domain attributes after generating data on the parent's attributes:
1. Get the list of after child domains,
2. for each child domain,
   a. set the loop,
   b. execute its beforeLoopEvent(child),
   c. while loop not equal to zero
      i. call traverseBeforeChildren(child),
      ii. call updateAttributes(child),
      iii. call traverseAfterChildren(child),
      iv. decrement loop
   d. execute its afterLoopEvent(child).

Figure 20:
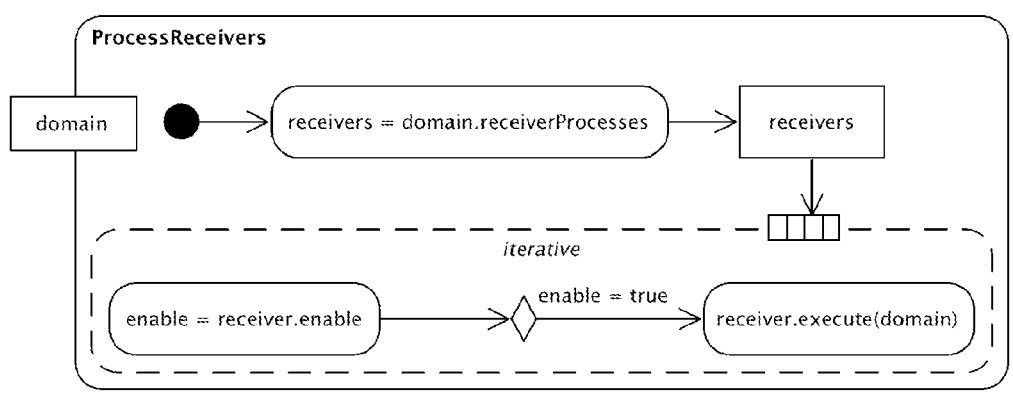
FIG. 20 depicts an activity diagram describing a ProcessReceivers action within an UpdateAttributes activity diagram in a system according to one practice of the invention.
Figure 21:
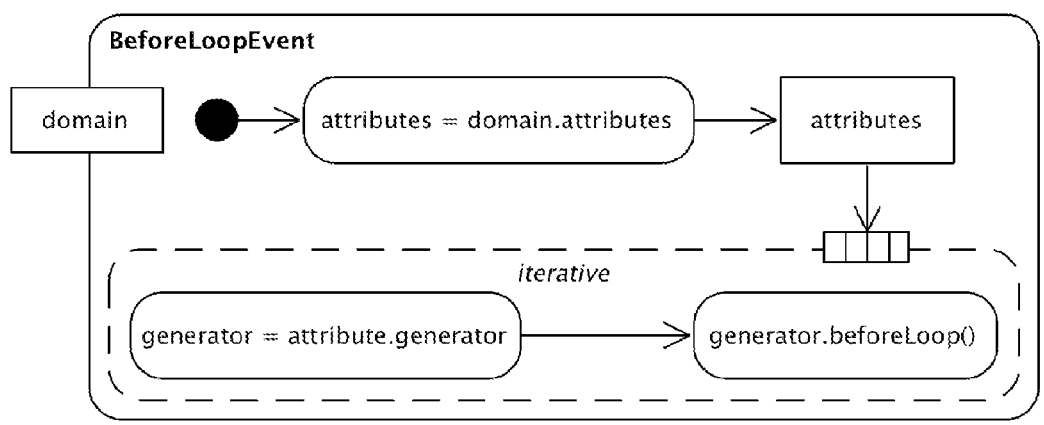
FIG. 21 depicts an activity diagram describing a BeforeLoopEvent action within TraverseBeforeChildren and TraverseAfterChildren activity diagrams in a system according to one practice of the invention.

Referring to FIG. 20, ProcessReceivers, there is shown an activity diagram describing a processReceivers action within the UpdateAttributes activity diagram that executes each receiver, which morphs the generated data from a given domain:
1. Get list of receivers for the given domain,
2. sort the receivers from lowest to highest sequence number,
3. if first iteration
   a. for each receiver
      i. execute beforeFirstExecute(domain)
4. else
   a. for each receiver
      i. if enabled, then morph the generated data Referring to FIG. 21, BeforeLoopEvent, there is shown an activity diagram describing a beforeLoopEvent action within the TraverseBeforeChildren and TraverseAfterChildren activity diagrams, that executes the beforeLoopEvent on each of a given domain's attribute's generator:
1. Get list of domain attributes,
2. for each attribute,
   a. get the generator,
   b. execute generateBeforeLoop method.

Figure 22:
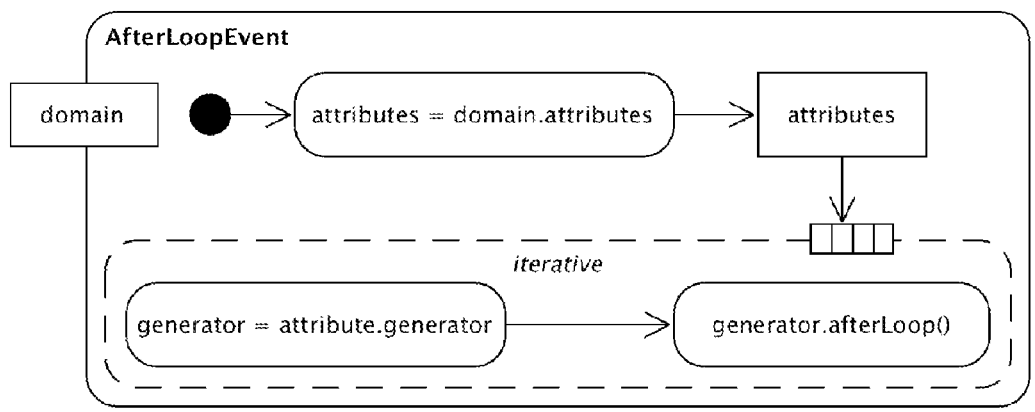
FIG. 22 depicts an activity diagram describing an AfterLoopEvent action within a TraverseBeforeChildren and TraverseAfterChildren activity diagrams in a system according to one practice of the invention.

Referring to FIG. 22, AfterLoopEvent, there is shown an activity diagram describing a afterLoopEvent action, within the TraverseBeforeChildren and TraverseAfterChildren activity diagrams, that executes the afterLoopEvent on each of a given domain's attribute's generator:
1. Get list of domain attributes,
2. for each attribute,
   a. get the generator,
   b. execute generateAfterLoop method.

Figure 23:
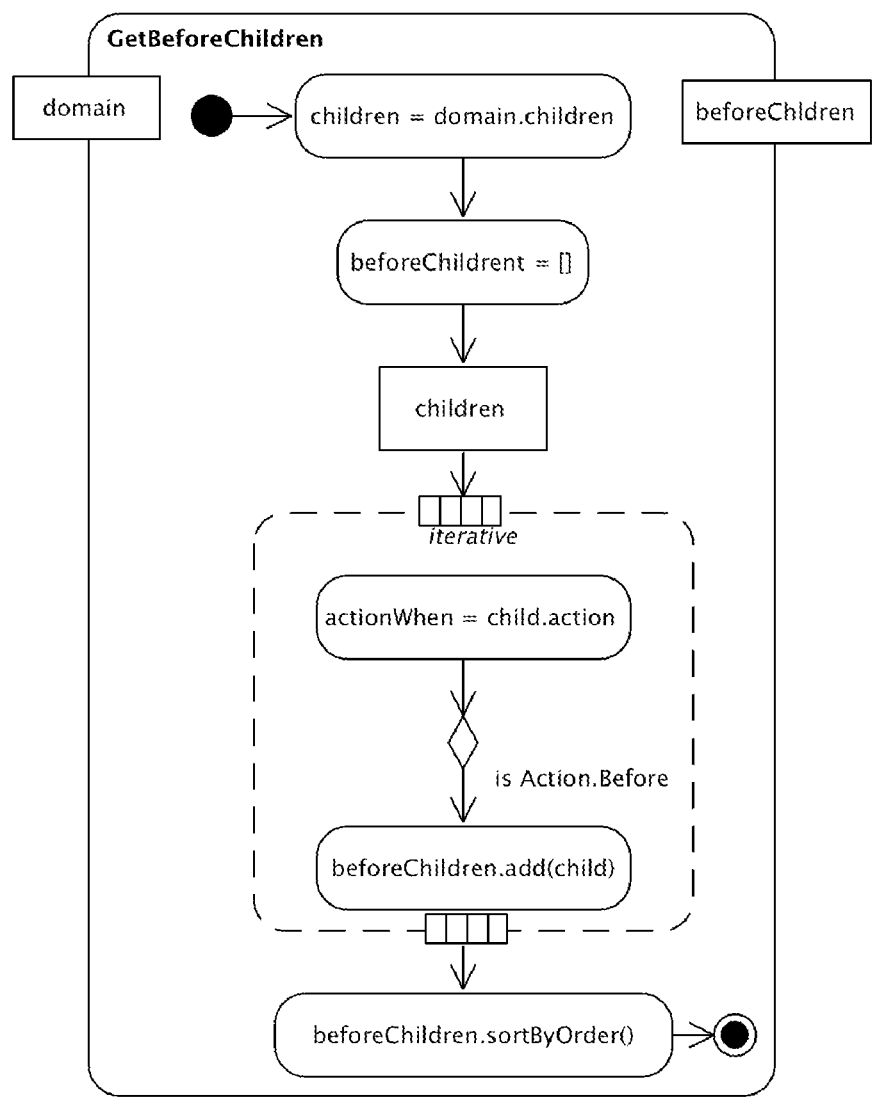
FIG. 23 depicts an activity diagram describing a GetBeforeChildren action within a TraverseBeforeChildren activity diagram in a system according to one practice of the invention.

Referring to FIG. 23, GetBeforeChildren, there is shown an activity diagram describing a getBeforeChildren action, within the TraverseBeforeChildren activity diagram, that retrieves child domains whose attribute's generators must be executed prior to the parents attribute's generators being executed:
1. Get list of children
2. create a beforeChildList
3. for each child
   a. if child is a beforeChild, then add to beforeChildList
4. sort the beforeChildList from lowest to highest sequence number.

Figure 24:
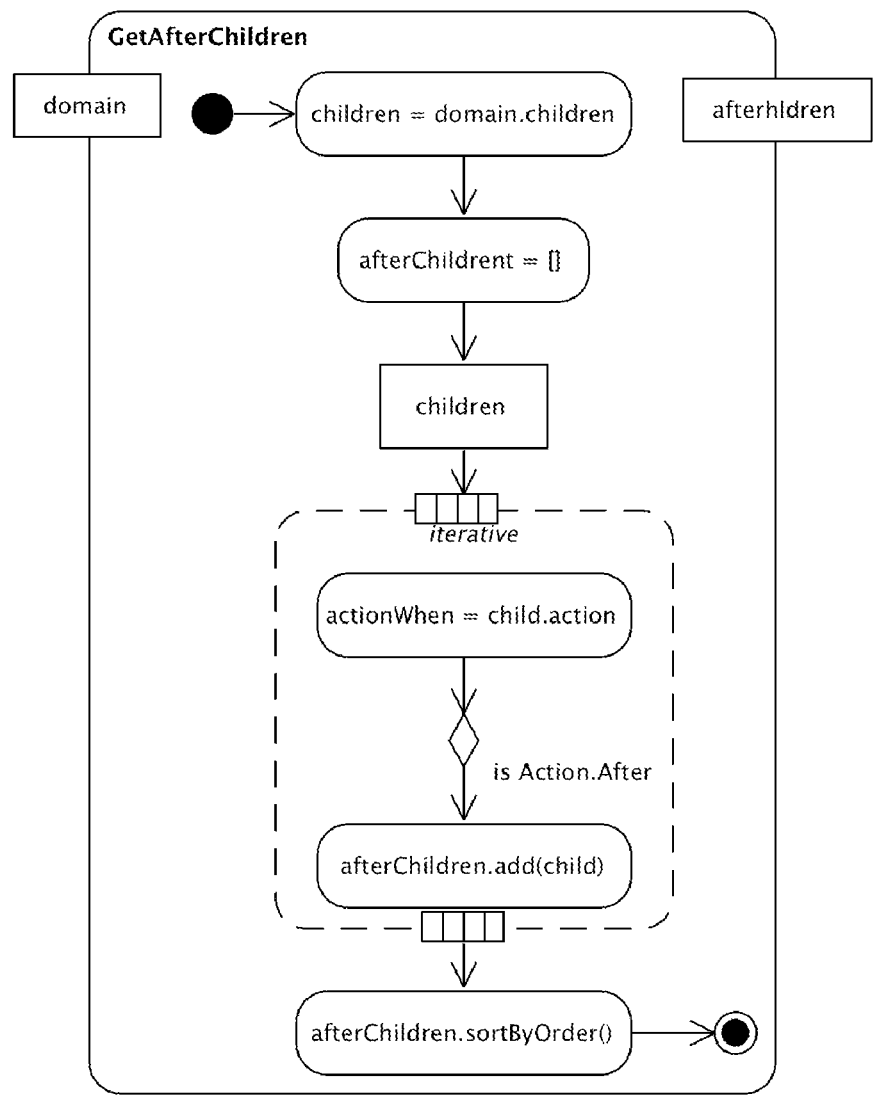
FIG. 24 depicts an activity diagram describing a getAfterChildren action within a TraverseAfterChildren activity diagram in a system according to one practice of the invention.

Referring to FIG. 24, GetAfterChildren, there is shown an activity diagram describing a getAfterChildren action within the TraverseAfterChildren activity diagram, that retrieves child domains whose attribute's generators must be executed after to the parents attribute's generators being executed:
1. Get list of children
2. create an afterChildList
3. for each child
   a. if child is an afterChild, then add to afterChildList
4. sort the afterChildList from lowest to highest sequence number.

Figure 25:
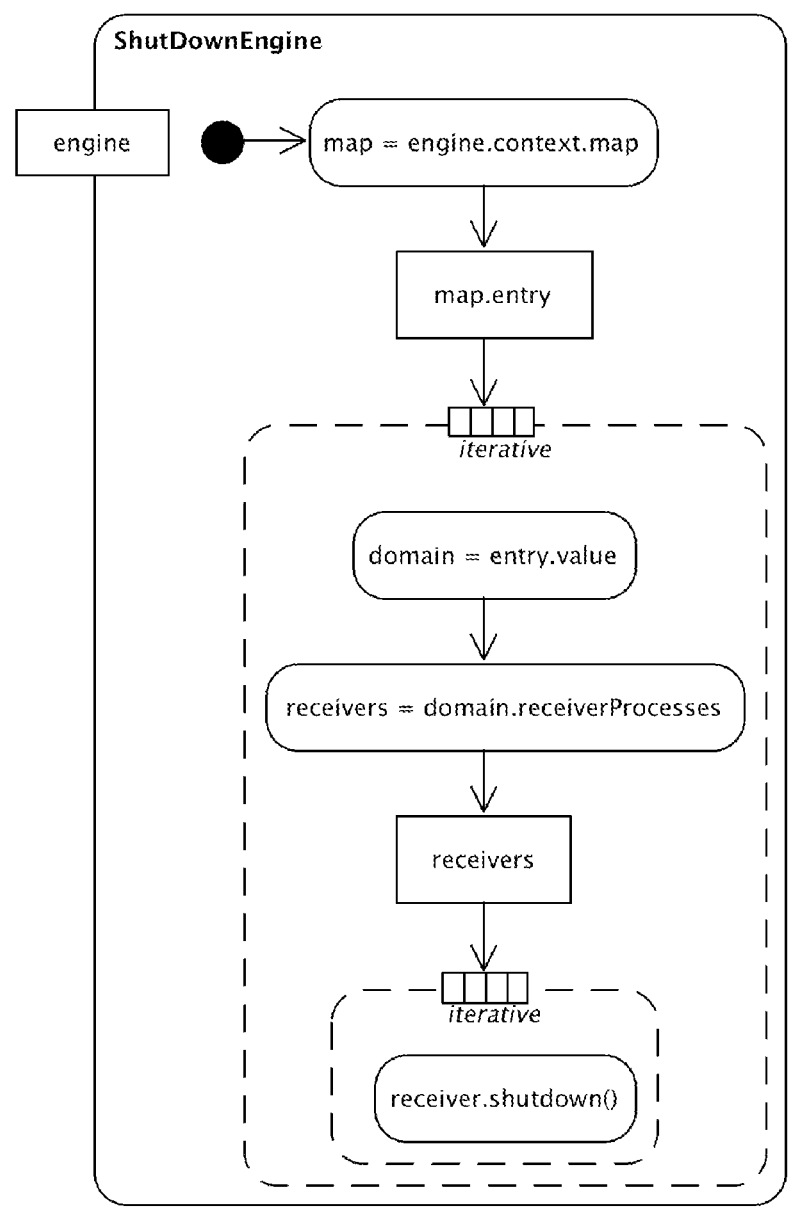
FIG. 25 depicts an activity diagram describing a shutdown action within a RunEngine activity diagram in a system according to one practice of the invention.

Referring to FIG. 25, ShutDownEngine, there is shown an activity diagram describing the shutdown action within the RunEngine activity diagram that performs the task of shutting down the engine after the last root domain loop has completed:
1. get the map of domains from the engine's context
2. for each domain entry within the map
   a. get the given domain's list of receivers
   b. for each receiver
      i. if the receiver is enabled, then execute its shutdown method.

A Component Overview

Figure 26:
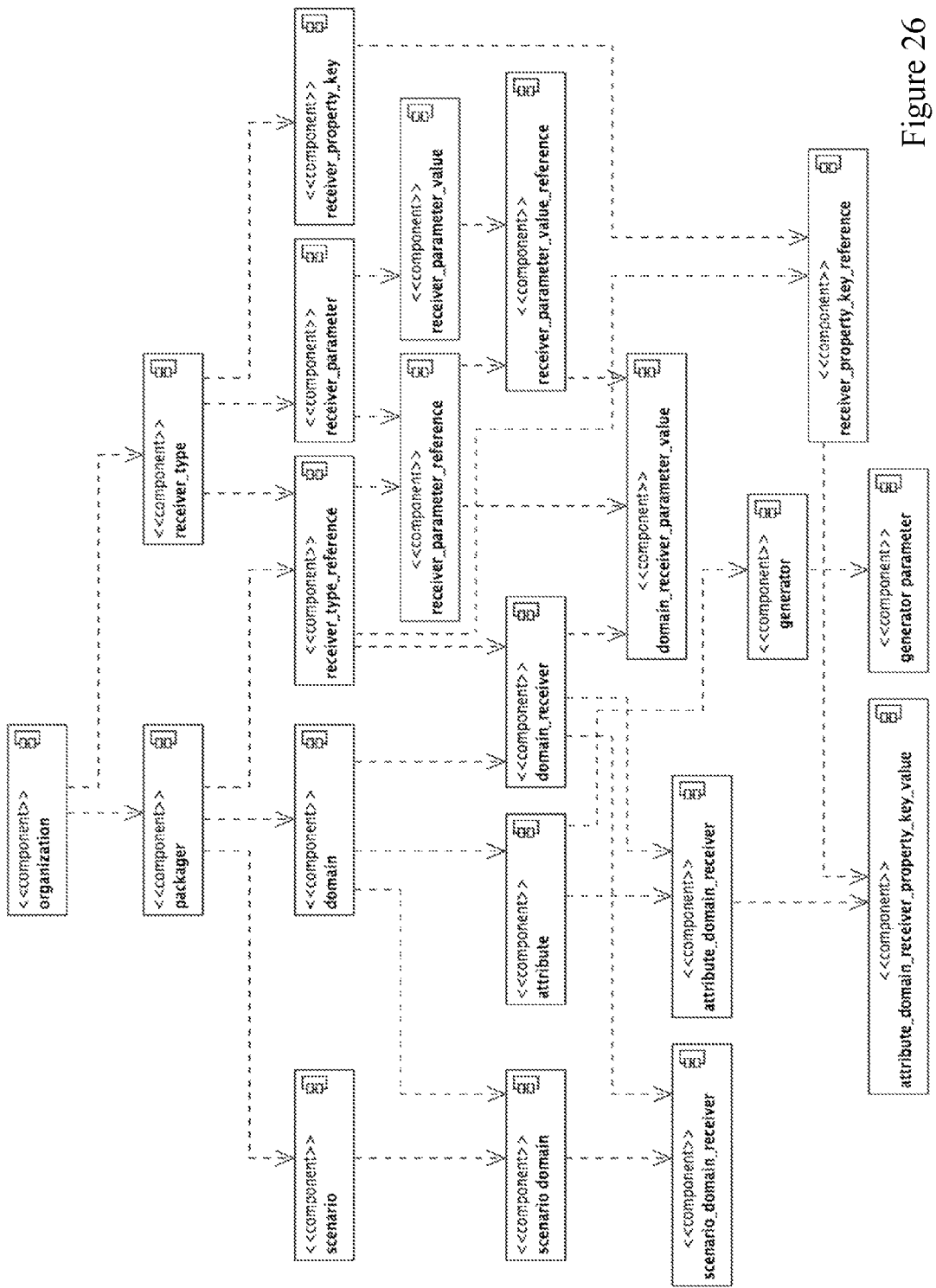
FIG. 26, depicts a possible hierarchy of components and their relationships in a system according to one practice of the invention.

Referring to FIG. 26, there is shown a component diagram depicting a possible hierarchy of components and their relationships to each other in which descriptions are stored and the Scenario Creator may traverse to describe and create Scenarios that the Engine may read and use the described parameters to create Domains, Attributes, Generators and Receivers to generate test data. There are a few component relationships that determine the basic relationships between Scenarios, Domains, Attributes, Generators and Receivers; all other relationships are suggestive:

Scenarios in relationship to Scenario Domains,
Scenario Domains in relationship to Domains,
Scenario Domains in relationship to Scenario Domain Receivers,
Scenario Domain Receivers in relationship to Receivers,
Domains in relationship to Attributes,
Attributes in relationship to Generators,
Domains in relationship to Receivers.

Described herein are systems and methods achieving the aforementioned objects, among others. It will be appreciated that the embodiments shown in the drawings and described in connection therewith are merely examples of the invention, and that other embodiments differing from those shown and described here also fall within the scope of the invention, of which we claim:

The invention claimed is:

1. A digital data processor-based test data generator, comprising:
   A. a digital data processing system comprising one or more digital data processors that are coupled for communications,
   B. a scenario creator that executes on the digital data processing system and that accepts, for each of one or more entities ("domains"), a plurality of parameters, including
      i. a hierarchical relationship between that entity and one or more other said entities,
      ii. a priority-of-test-data-creation relationship between that entity and one or more other entities,
      iii. one or more attributes of that entity,
   C. the scenario creator generating a parameter set that defines a test data set specifying the aforesaid entities, relationships and attributes,
   D. an engine that executes on the digital data processing system and that responds to the parameter set by generating the test data set by enumerating values for the entities and their attributes in an order determined as a function of:
      i. the hierarchical relationship between that entity and one or more other said entities,
      ii. a priority-of-test-data-creation relationship between that entity and one or more other entities,
      iii. one or more attributes of that entity;
   E. wherein, the engine generates the test data set by enumerating said values by recursively traversing said entities in accord with their respective hierarchical relationships, beginning with a root entity as defined by said hierarchical relationship; and
   F. for each entity the engine traverses, the engine generates test data for that entity and its attributes: (i) after recursively traversing children of that entity having the higher priority-of-test-data-creation relationship, and (ii) before recursively traversing children or that entity having the lower priority-of-test-data-creation relationship.

2. The test data generator of claim 1, wherein the engine generates the test data set by enumerating values for entities that are higher in the hierarchy before entities that are lower in the hierarchy.

3. The test data generator of claim 1, wherein the engine generates the test data set by enumerating values for entities having a higher priority-of-test-data-creation before entities having a lower priority-of-test-data-creation.

4. The test data generator of claim 1, wherein the engine generates the test data set enumerating values for entities that are siblings in the hierarchical relationship such that value(s) for a sibling having a lower sequence specifier is/are generated before value(s) for a sibling having a higher sequence specifier.

5. The test data generator of claim 1, wherein
   A. the scenario creator accepts, for at least two of the entities, a sequence specifier, and generates the parameter set to include that sequence specifier, and
   B. the engine generates the test data set by enumerating values for entities that are siblings in the hierarchical relationship such that values for a sibling having a lower sequence specifier are generated before values for a sibling having a higher sequence specifier.

6. The test data generator of claim 1, wherein the scenario creator accepts a drag-and-drop operation executed by a user as specifying a hierarchical relationship between a said entity and one or more other said entities.

7. The test data generator of claim 1, wherein the scenario creator accepts a drag-and-drop operation executed by a user with respect to a pair of entities as specifying one or more attributes of one of those entities.

8. The test data generator of claim 1, wherein
   A. the scenario creator accepts, for at least one of the attributes, an identity of a software component ("generator") suitable for enumerating test data for that attribute, and generates the parameter set to include that identity, and
   B. the engine generates the test data set by enumerating values for that attribute using that generator.

9. The test data generator of claim 1, wherein
   A. the scenario creator accepts, for at least one of the attributes, an identity of a software component ("receiver") suitable for formatting test data for application to logic under test, and generates the parameter set to include that identity, and
   B. the engine generates the test data set by formatting values for that attribute using that receiver.

10. A method of test data generation, comprising the steps of:
   A. with a digital data processor of a digital data processing system, accepting, for each of one or more entities ("domains"), a plurality of parameters, including
      i. a hierarchical relationship between that entity and one or more other said entities,
      ii. a priority-of-test-data-creation relationship between that entity and one or more other entities,
      iii. one or more attributes of that entity,
   B. with a said digital data processing apparatus, generating a parameter set that defines a test data set specifying the aforesaid entities, relationships and attributes,
   C. with a said digital data processor, responding to the parameter set by generating the test data set by enumerating values for the entities and their attributes in an order determined as a function of:
      i. the hierarchical relationship between that entity and one or more other said entities,
      ii. a priority-of-test-data-creation relationship between that entity and one or more other entities,
      iii. one or more attributes of that entity;
   E. wherein, the engine generates the test data set by enumerating said values by enumerating said values by recursively traversing said entities in accord with their respective hierarchical relationships, starting with a root entity as defined by said hierarchical relationship; and
   F. step(E) includes, for each entity the enigine traverses, generating test data for that entity and its attributes: (i) after recursively traversing children if that entity having the higher priority-of-test-data-creation relationship, and (ii) before recursively traversing children of that entity having the lower priority-of-test-data-creation relationship.

11. The method of test data generation of claim 10, wherein step (C) includes generating the test data set by enumerating values for entities that are higher in the hierarchy before entities that are lower in the hierarchy.

12. The method of test data generation of claim 10, wherein step (C) includes generating the test data set by enumerating values for entities having a higher priority-of-test-data-creation before entities having a lower priority-of-test-data-creation.

13. The method of test data generation of claim 10, wherein step (C) includes generating the test data set enumerating values for entities that are siblings in the hierarchical relationship such that value(s) for a sibling having a lower sequence specifier is/are generated before value(s) for a sibling having a higher sequence specifier.

14. The method of test data generation of claim 10, wherein
   step (A) includes accepting, for at least two of the entities, a sequence specifier, and generating the parameter set to include that sequence specifier, and
   step (C) includes generating the test data set by enumerating values for entities that are siblings in the hierarchical relationship such that values for a sibling having a lower sequence specifier are generated before values for a sibling having a higher sequence specifier.

15. The method of test data generation of claim 10, wherein step (A) includes accepting a drag-and-drop operation executed by a user as specifying a hierarchical relationship between a said entity and one or more other said entities.

16. The method of test data generation of claim 10, wherein step (A) includes accepting a drag-and-drop operation executed by a user with respect to a pair of entities as specifying one or more attributes of one of those entities.

17. The method of test data generation of claim 10, wherein
   step (A) includes accepting, for at least one of the attributes, an identity of a software component ("generator") suitable for enumerating test data for that attribute, and generating the parameter set to include that identity, and
   step (C) includes generating the test data set by enumerating values for that attribute using that generator.

18. The method of test data generation of claim 10, wherein
   step (A) includes accepting, for at least one of the attributes, an identity of a software component ("receiver") suitable for formatting test data for application to logic under test, and generating the parameter set to include that identity, and
   step (C) includes generating the test data set by formatting values for that attribute using that receiver.

* * * * *